(12) United States Patent
Orcutt

(10) Patent No.: US 7,417,779 B2
(45) Date of Patent: *Aug. 26, 2008

(54) SINGLE PIECE TORSIONAL HINGED DEVICE WITH CENTRAL SPINES AND PERIMETER RIDGES TO REDUCE FLEXING

(75) Inventor: John W. Orcutt, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 316 days.

This patent is subject to a terminal disclaimer.

(21) Appl. No.: 11/066,834

(22) Filed: Feb. 24, 2005

(65) Prior Publication Data

US 2005/0225821 A1 Oct. 13, 2005

Related U.S. Application Data

(63) Continuation-in-part of application No. 10/681,934, filed on Oct. 9, 2003, now Pat. No. 6,956,684, and a continuation-in-part of application No. 10/682,015, filed on Oct. 9, 2003, now Pat. No. 6,999,215.

(60) Provisional application No. 60/556,121, filed on Mar. 24, 2004, provisional application No. 60/424,915, filed on Nov. 8, 2002.

(51) Int. Cl.
*G02B 26/08* (2006.01)

(52) U.S. Cl. ............... 359/224; 359/198; 359/199; 359/210

(58) Field of Classification Search ................. 359/224
See application file for complete search history.

(56) References Cited

U.S. PATENT DOCUMENTS 6,956,684 B2 * 10/2005 Orcutt ................. 359/198
7,050,211 B2 * 5/2006 Orcutt ................. 359/224

* cited by examiner

*Primary Examiner*—James Phan
(74) *Attorney, Agent, or Firm*—William B. Kempler; W. James Brady, III; Frederick J. Telecky, Jr.

(57) ABSTRACT

A torsional hinged device having an optical surface, such as a mirror or refractive surface, formed from a single piece of silicon with reduced flexing. In addition to central spines to prevent or reduce flexing of the tips of the optical surface, the device may also include perimeter ridges to further reduce or prevent flexing as well as reduce warping of the edges of the optical surface. To allow balancing of the device so that the center of mass of the assembly is on the pivoting axis, a recess is formed in the back portion to receive a permanent drive/sense magnet.

20 Claims, 4 Drawing Sheets

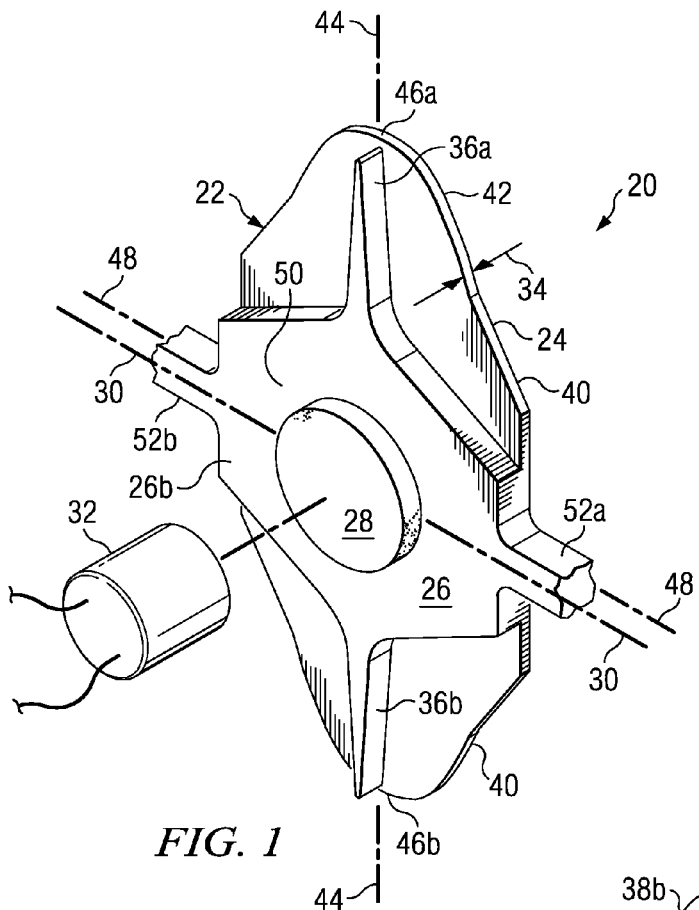
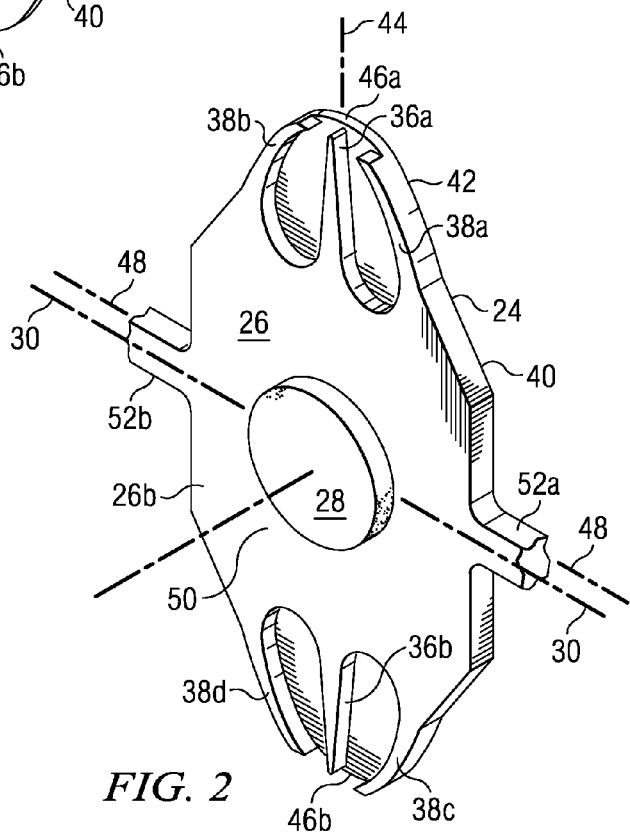
FIG. 1
FIG. 2

SINGLE PIECE TORSIONAL HINGED DEVICE WITH CENTRAL SPINES AND PERIMETER RIDGES TO REDUCE FLEXING

This application claims the benefit of U.S. Provisional Application No. 60/556,121, filed on Mar. 24, 2004; and is a Continuation-In-Part of U.S. application Ser. No. 10/681,934 filed on Oct. 9, 2003, now U.S. Pat. No. 6,956,684 which claims benefit to Provisional Application No. 60/424,915, filed on Nov. 8, 2002; and is a Continuation-In-Part of U.S. application Ser. No. 10/682,015 filed on Oct. 9, 2003, now U.S. Pat. No. 6,999,215 which claims benefit to Provisional Application No. 60/424,915, filed on Nov. 8, 2002. Each of these applications is hereby incorporated herein by reference.

CROSS-REFERENCE TO RELATED APPLICATIONS

This application relates to the following co-pending and commonly assigned patent applications: Ser. No. 11/054,926, filed Feb. 10, 2005, entitled A Multilayer Torsional Hinged Mirror With A Recessed Drive/Sensing Permanent Magnet; and Ser. No. 11/055,392, filed Feb. 10, 2005, entitled A Torsional Hinged Mirror Assembly With Central Spines And Perimeter Ridges To Reduce Flexing, which applications are hereby incorporated herein by reference.

TECHNICAL FIELD

The present invention relates to maintaining an optical surface with reduced flexing during the operation of a torsional hinged device such as a mirror, and more particularly to inexpensive one piece torsional hinged optical devices and especially mirrors.

BACKGROUND

Pivoting or oscillating torsional hinged mirrors provide very effective yet inexpensive replacements for spinning polygon shaped mirrors in printers and some types of displays. As will be appreciated by those skilled in the art, torsional hinged mirrors may be MEMS type mirrors etched from a silicon substrate using processes similar to those used in the manufacture of semiconductor devices. Many torsional hinged mirrors provide a raster type scan for printers and displays and operate at rotational speeds of about 3 KHz. However, as the demand for higher print speeds and better resolution increases, flatness of the mirror reflective surface has now become a much more serious problem. As the mirror continuously flexes or bends back and forth during the continuous oscillations about the axis, the greatest deformation is at the tip or ends of the flexing mirror. Presently available mirrors have substantially reduced this problem by the use of several bonded layers of material such as silicon. Unfortunately, manufacturing a mirror comprised of two or more layers significantly increases costs. In addition, the greater rotational speeds and demand for thinner mirrors, has also resulted in some flexing of the mirror around the edges of the mirror during operation.

More specifically, referring to the prior art FIG. 5A, there is illustrated a single piece torsional hinged device 10 such as a mirror or other optical surface that oscillates on its torsional hinges 12a and 12b about a pivoting axis 14. Although perhaps exaggerated, the cross-sectional view of FIG. 5B illustrates how the top half of an optical surface portion or mirror 16 of device 10 flexes during a complete pivoting cycle. This type of excessive flexing is unacceptable, although some flexing can be tolerated for many applications. As discussed above, the excessive flexing may be solved by a multi-layer mirror or device. However, for many uses, the multi-layer mirrors or devices are too expensive.

Therefore, it would be advantageous to provide an inexpensive torsional hinged optical surface or mirror that has reduced flexing. Other optical surfaces, such as refractive surfaces, would also benefit from the teachings of this invention.

SUMMARY OF THE INVENTION

These and other problems are generally solved or circumvented, and technical advantages are generally achieved, by preferred embodiments of the present invention, which provide a single piece torsional hinged device having reduced flexing. The single piece device comprises a front portion that defines an optical surface, such as a reflective surface or a refractive surface, with a selected perimeter edge. A first dimension of the front portion extends between first and second ends or tips. A second dimension of the optical surface is orthogonal to the first dimension.

A back portion of the device is integrally formed with the front portion and includes a center area and first and second end areas. Each of the first and second end areas defines a central spine extending from the center area along the first dimension and toward the first and second tips of the front portion respectively. There may also be included a pair of perimeter ridges that extend from the center area of the back portion along the perimeter edge of the front portion toward the first and second tips respectively.

According to a first embodiment of the invention, the front portion and back portion comprise a single unitary or integral piece of material, such as for example a silicon substrate. The central spine may be formed by using typical MEMS semiconductor manufacturing processes. The silicon material comprising the back portion is etched so as to define the central spines. A second embodiment similar to the first embodiment may further include perimeter ridges also etched into the back portion of the single piece of silicon.

The center area of the back portion also defines a pair of torsional hinges that extend away from the center area and along a pivot axis that is parallel to the second dimension. The torsional hinges then terminate at first and second anchor members that are attached to a support structure.

A permanent magnet that may function as a drive magnet or alternately a sensing magnet may be mounted to the back portion of the device. A magnetic coil that interacts with the permanent magnet is positioned proximate the magnet.

According to another embodiment, one or both of the torsional hinges may define an enlarged area. A permanent drive magnet is then bonded to the enlarged area(s). If this arrangement is used, a permanent magnet mounted to the back portion of the device would typically be used as a sensing magnet to determine the rotational position of the device. However, in an alternate embodiment, a permanent magnet on one enlarged area may be used to impart oscillating motion and the magnet on the other enlarged area may be used as a sensing magnet.

According to still another embodiment of the invention, the center area of the back portion of the device defines a recess for receiving a drive/sensing permanent magnet. The permanent magnet is mounted in the recess to provide pivotal motion to the complete assembly, or to act as part of a circuit to sense and monitor the pivotal motion of the device. It will also be appreciated that the optical surface of the device may be a reflective surface, such as a flat mirror or a mirror with a selected curvature. Alternately, the optical surface may be a refractive surface such as a fresnel or gradient lens or a transparent refractive lens.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 illustrates a single piece torsional hinged device according to an embodiment of the present invention;

FIG. 2 is similar to the mirror device of FIG. 1 and further illustrates perimeter ridge structures along the edges of the optical surface portion;

DETAILED DESCRIPTION OF ILLUSTRATIVE EMBODIMENTS

Figure 3:
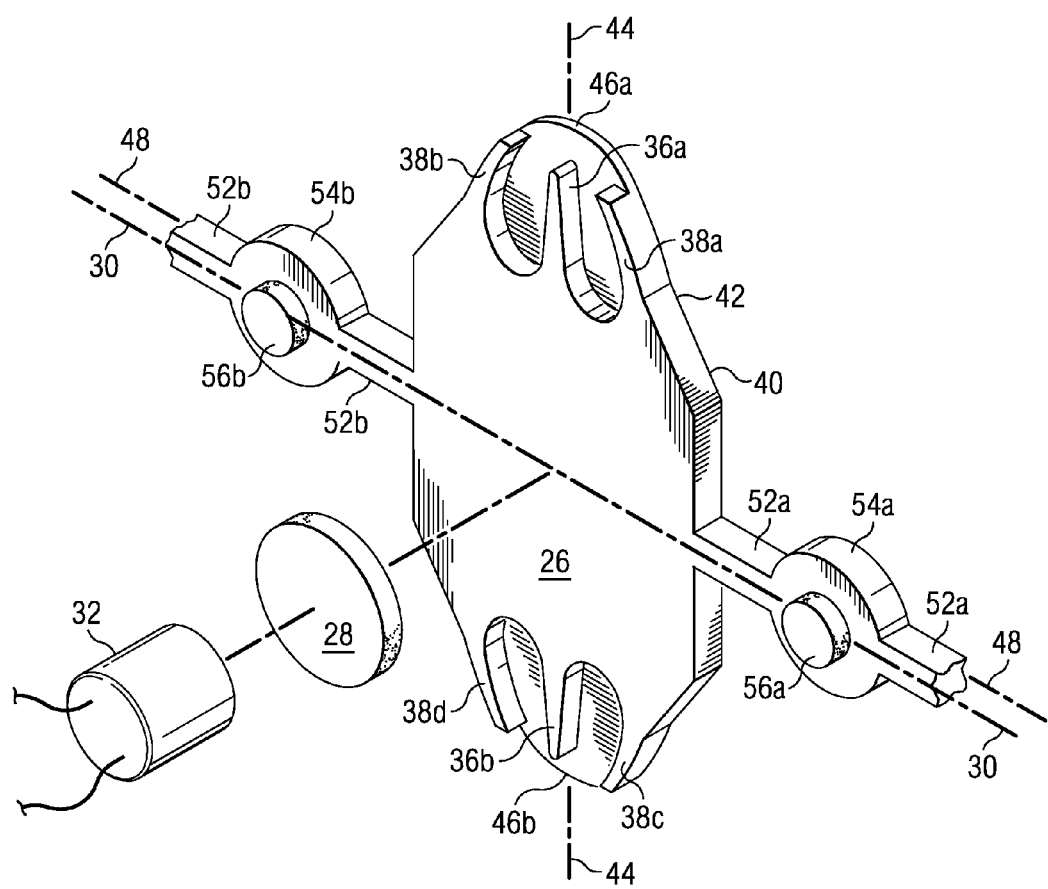
FIG. 3 illustrates the use of a drive magnet mounted to an enlarged area on at least one of the torsional hinges, and may be used with both the embodiments of FIG. 1 or FIG. 2.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Referring now to FIG. 1, there is shown a back view of a first embodiment of the assembly 20 of the present invention having an optical surface, such as for example a mirror. As shown, the device 22 is formed from a single piece of material such as silicon, and comprises a front portion 24 defining an optical surface such as a reflective surface or a refractive surface integral with a back portion 26. A permanent magnet 28 is bonded to the back side 26b of back portion 26. As will be described in more detail later, permanent magnet 28 may be a drive magnet for imparting oscillating rotation about a pivoting axis 30 to the assembly. In one embodiment, the device assembly with the magnet oscillates at its resonant frequency. Alternatively, permanent magnet 28 may be used as a monitor or sensing magnet to provide information concerning the pivotal motion of the device 22.

Further, permanent magnet 28 is preferably selected so that the center of mass of the device 22, with the magnet attached, lies on pivoting axis 30. The embodiment of FIG. 1 also includes a magnetic coil 32 that interacts with permanent magnet 28 to provide the rotational torque to the device 22. Alternately as discussed above, the permanent magnet 28 may be a sensing magnet for providing information about the movement of the device 22 due to changes in magnetic flux as the position of the permanent magnet changes.

Referring again to FIG. 1, it is seen that the front portion 24 of device 22 includes a selected thickness as indicated by double arrows 34, and that back portion 26 includes central spines 36a and 36b. Although not necessary, the back portion 26b will typically have a greater thickness than the front portion 24.

According to a second embodiment of the invention and as illustrated in FIG. 2, there may also be included a pair of perimeter ridges 38a and 38b at a first end of the device and perimeter ridges 38c and 38d at the other end. As mentioned above, the front portion 24 with the optical surface and the back portion 26 of the device 22 is comprised of a single or unitary piece of silicon with the support spines 36a and 36b, and the perimeter ridges 38a, 38b, 38c and 38d etched into the silicon of the back portion 26. According to the embodiments of both FIGS. 1 and 2, the front portion 24 of device 22 defines a front optical surface 40, such as a mirror or refractive surface having a perimeter edge 42. A first dimension 44 of the device 22 extends between a first end or tip 46a and a second end or tip 46b (shown in FIGS. 1 and 2). A second dimension 48 extends orthogonally to the first dimension, and parallel to the pivoting axis 30. The back portion 26 of the device 24 is formed to define a center portion 50, and the central spines 36a and 36b extend from the center portion 50 parallel to the first dimension 44 toward the first and second ends or tips 46a and 46b as shown in FIG. 1. The perimeter ridges 38a-38d, shown in FIG. 2 also extend from the center portion 50 and follow the perimeter edge 42 of the device 22 toward the first and second ends. The back portion 26 of the embodiments of both FIG. 1 and FIG. 2 also includes a pair of torsional hinges 52a and 52b that extend from the center section 50 along the pivoting axis 30. Pivoting axis 30 is parallel to the second dimension 48 as mentioned above. Also as shown in FIGS. 1 and 2 and as is discussed above, permanent magnet 28 may be bonded to the backside 26b of back portion 26 to provide rotational motion about the pivotal axis. Alternately, the permanent magnet 28 may be used to provide information about the pivotal movement of the device.

Referring to FIG. 3, there is shown another feature of the invention that may be used with the embodiments of both FIG. 1 and FIG. 2. As shown in FIG. 3, the device 22 further comprises an enlarged area 54a that is formed as part of torsional hinge 52a. A permanent magnet 56a may be bonded to the enlarged area 54a to provide pivotal rotation to the device assembly in a manner know by those skilled in the art. It should also be appreciated that a similar enlarged area for supporting a second permanent magnet could be formed as part of torsional hinge 52b. Referring again to FIG. 3, it will be appreciated that the enlarged area 54a and permanent magnet 56a may be used to provide motion to the device 22, while the permanent magnet 28 and sensing coil 32 provide feedback information concerning the pivotal movement of the assembly. Alternately, if both torsional hinges include enlarged areas and permanent magnets, one magnet and associated coil can be used to provide pivotal motion and the other magnet and associated coil can be used as a sensing device to monitor the pivotal motion. It should be appreciated, of course, that the invention covers embodiments with and without the enlarged areas 54a and permanent magnet 56a. Further, other drive techniques may be used to provide rotational or pivotal motion to the assembly. For example, as will be appreciated by those skilled in the art, a pair of piezoelectric units may be used to input resonant motion to the assembly.

It should also be appreciated that the figures illustrating the invention are not necessarily to scale, and may be intentionally distorted to emphasize and help explain details of the invention.

Figure 4:
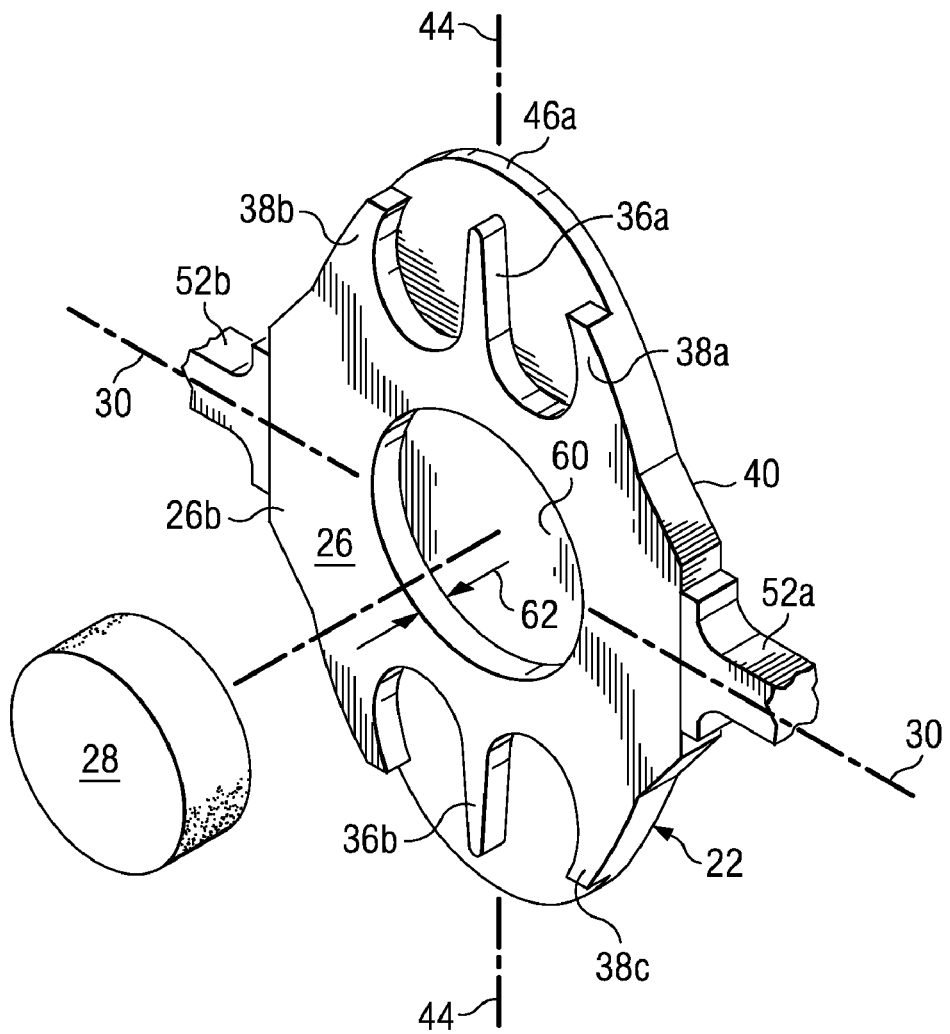
FIG. 4 illustrates another embodiment similar to FIGS. 1, 2, and 3 but further includes a recess defined in the back portion of the center area for receiving a permanent drive/sensing magnet.
Figure 5B:
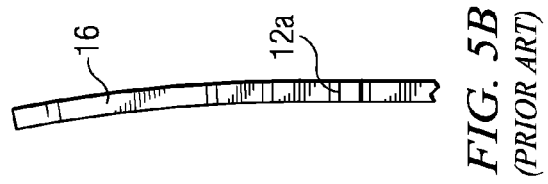
FIG. 5A is a perspective view and FIG. 5B is a partial cross-sectional view taken along line 5b-5b of FIG. 5A illustrating the flexing problem of prior art mirror structures solved by the present invention.
Figure 5A:
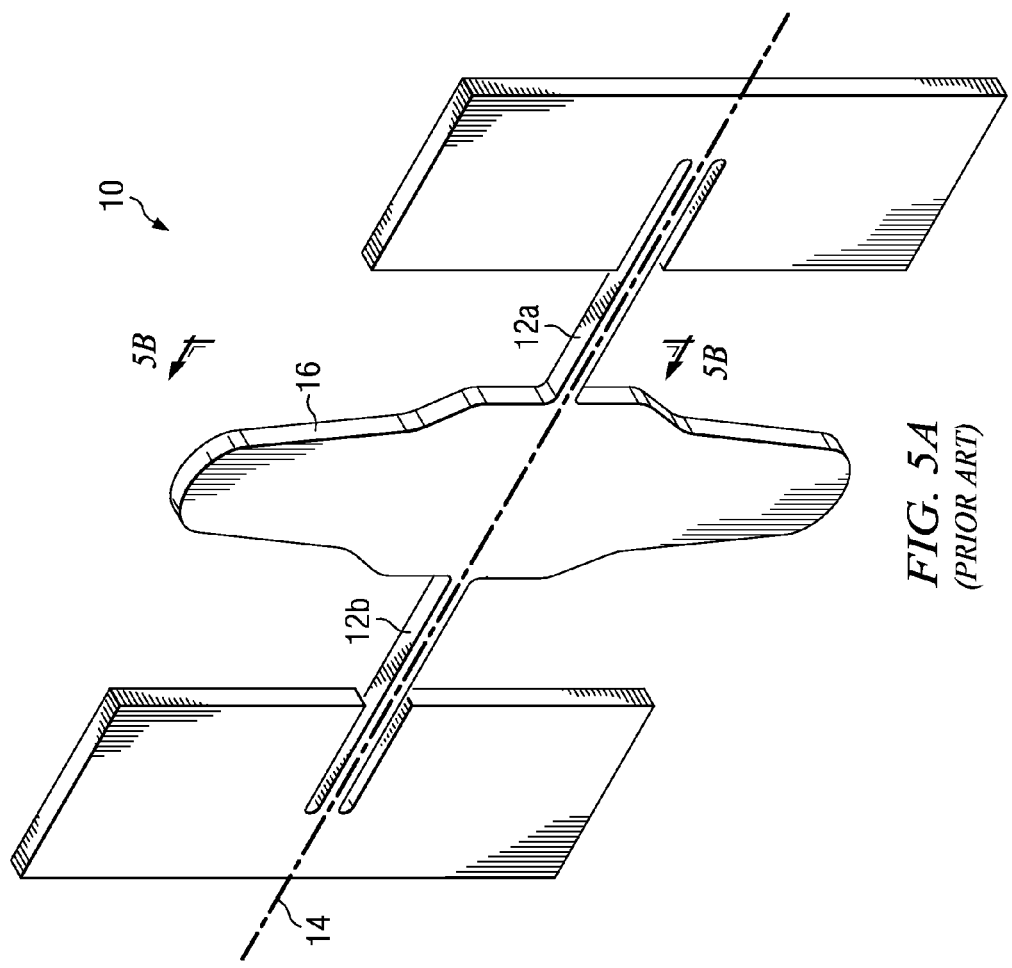

Referring now to FIG. 4, there is illustrated another embodiment of the invention. FIG. 4 is similar to the embodiment of FIGS. 1, 2, and 3, except that instead of a permanent magnet 28 being bonded to the backside of back portion 26 as discussed above, a recess 60 is formed in the back portion 26 for receiving the permanent magnet 28. The depth of the recess 60 as indicated by the double arrows 62 may be adjusted so that the center of mass of the combined mirror device 22 and the permanent magnet 28 lies on the pivoting axis 30.

From the foregoing, it should be appreciated by those skilled in the art that the use of central spines and perimeter edges, as taught by the present invention, may be used advantageously to reduce flexing of an oscillating mirror or other optical surfaces. More specifically, the oscillating optical surface may be a flat mirror or a mirror with a selected curvature. Alternately, the optical surface could be a refractive optical surface such as a gradient or fresnel (refractive and reflective) lens, or a transparent refractive lens that passes light completely through the optical structure.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the mirror assembly described in the specification. As one of ordinary skill in the art will readily appreciate from the disclosure of the present invention, mirror devices later to be developed, that perform substantially the same function or achieve substantially the same result as the corresponding embodiments described herein may be utilized according to the present invention. Accordingly, the appended claims are intended to include within their scope such mirror devices.

What is claimed is:

1. A single piece torsional hinged device comprising:
   a front portion defining an optical surface with a perimeter edge, and having a first dimension and a second dimension orthogonal to said first dimension, said first dimension extending between first and second ends of said optical surface;
   a back portion integral with said front portion, said back portion including a center section and first and second end sections, each of said first and second end sections defining a central spine extending from said center section along said first dimension; and
   a pair of torsional hinges integrated with extending away from said center section and along a pivotal axis, said pivotal axis parallel to said second dimension.

2. The single piece torsional hinged device of claim 1 wherein said first and second end sections of said back portion further comprise a pair of perimeter ridges extending from said center section of said back portion and along said perimeter edges of said front portion toward said first and second ends.

3. The single piece torsional hinged device of claim 1 and further comprising a permanent magnet mounted to said back portion.

4. The single piece torsional hinged device of claim 3 further comprising a magnetic coil that interacts with said permanent magnet.

5. The single piece torsional hinged device of claim 4 wherein said permanent magnet and said coil provide rotational energy to said torsional hinged device.

6. The single piece torsional hinged device of claim 5 wherein said torsional hinged device oscillates at its resonant frequency.

7. The single piece torsional hinged device of claim 4 wherein said permanent magnet and said coil operate as a sensing device.

8. The single piece torsional hinged device of claim 1 wherein at least one of said pair of torsional hinges further defines an enlarged area and further comprising a permanent magnet attached to said enlarged area for imparting oscillating motion to said torsional hinged device.

9. The single piece torsional hinged device of claim 8 and further comprising at least one magnetic coil that interacts with said permanent magnet attached to said at least one enlarged area.

10. The single piece torsional hinged device of claim 9 and further comprising a sensing magnet mounted to the backside of said back portion and a magnetic coil that interacts with said sensing magnet.

11. The single piece torsional hinged device of claim 8 wherein both torsional hinges of said pair of torsional hinges define enlarged areas and wherein each enlarged area has a permanent magnet attached thereto.

12. The single piece torsional hinged device of claim 11 wherein one magnet on one of said enlarged areas is for imparting oscillating motion and the magnet on another one of said enlarged areas is a sensing magnet.

13. The single piece torsional hinged device of claim 11 wherein both magnets on said enlarged areas are for imparting oscillating motion.

14. The single piece torsional hinged device of claim 11 and further comprising first and second magnetic coils that interact with said permanent magnets on said enlarged areas.

15. The single piece torsional hinged device of claim 1 wherein said center section of said back portion defines a recess and further comprises a permanent magnet mounted in said recess.

16. The single piece torsional hinged device of claim 1 and further comprising a piezoelectric drive unit to impart said oscillating motion to said torsional hinged device.

17. The single piece torsional hinged device of claim 16 and further comprising a permanent magnet mounted to the backside of said back portion, and a magnetic coil that interacts with said permanent magnet, said magnet and magnetic coil operating as a sensing device.

18. The single piece torsional hinged device of claim 1 wherein said optical surface is a reflective surface or mirror.

19. The single piece torsional hinged device of claim 1 wherein said optical surface is a refractive surface.

20. The single piece torsional hinged device of claim 19 wherein said refractive surface is a transparent lens.

* * * * *